United States Patent
Lin

(10) Patent No.: US 10,096,357 B2
(45) Date of Patent: Oct. 9, 2018

(54) DATA STORAGE DEVICE AND DATA WRITING METHOD THEREOF

(71) Applicant: Silicon Motion, Inc., Jhubei (TW)

(72) Inventor: Wen-Sheng Lin, Kaohsiung (TW)

(73) Assignee: Silicon Motion, Inc., Jhubei (TW)

( * ) Notice: Subject to any disclaimer, the term of this patent is extended or adjusted under 35 U.S.C. 154(b) by 0 days.

(21) Appl. No.: 15/659,216

(22) Filed: Jul. 25, 2017

(65) Prior Publication Data
US 2018/0114570 A1    Apr. 26, 2018

(30) Foreign Application Priority Data

Oct. 25, 2016    (TW) .............................. 105134401 A

(51) Int. Cl.

| G11C 16/04 | (2006.01) |
|---|---|
| G11C 11/56 | (2006.01) |
| G11C 16/08 | (2006.01) |
| G11C 16/10 | (2006.01) |
| G11C 16/28 | (2006.01) |

(Continued)

(52) U.S. Cl.
CPC ...... *G11C 11/5628* (2013.01); *G11C 11/5621* (2013.01); *G11C 16/0483* (2013.01); *G11C 16/08* (2013.01); *G11C 16/10* (2013.01); *G11C 16/22* (2013.01); *G11C 16/225* (2013.01); *G11C 16/28* (2013.01); *G11C 16/3459* (2013.01); *G11C 2211/5621* (2013.01); *G11C 2211/5641* (2013.01); *G11C 2211/5642* (2013.01); *G11C 2211/5648* (2013.01); *G11C 2216/14* (2013.01)

(58) Field of Classification Search
CPC ..... G11C 29/52; G11C 16/10; G11C 11/5642; G11C 16/26; G11C 11/5628; G11C 16/0483; G11C 2029/0411; G11C 16/349; G11C 16/08; G11C 11/5671; G11C 16/3459
USPC ............ 365/185.03, 185.02, 185.09, 185.11, 365/185.12
See application file for complete search history.

(56) References Cited

U.S. PATENT DOCUMENTS

| 2011/0307646 A1 | 12/2011 | Lee et al. |
|---|---|---|
| 2013/0145085 A1 | 6/2013 | Yu et al. |
| 2014/0006688 A1 | 1/2014 | Yu et al. |

(Continued)

FOREIGN PATENT DOCUMENTS

| TW | 201243851 A | 11/2012 |
|---|---|---|
| TW | 201321978 A | 6/2013 |
| TW | 201403318 A | 1/2014 |

OTHER PUBLICATIONS

Office Action of corresponding TW application, published on Jul. 20, 2017.

*Primary Examiner* — Thong Q Le
(74) *Attorney, Agent, or Firm* — Wang Law Firm, Inc.

(57) ABSTRACT

The present invention provides a data storage device including a flash memory and a controller. The controller checks whether a first number of a first page in the flash memory is greater than a predetermined threshold when the data storage device resumes operation after a power-off event, and stops writing data into a first TLC block when the first number of the first page is greater than the predetermined threshold, wherein the first TLC block was undergoing a first write operation which was unfinished when the power-off event occurred, and the first page was the last one being written in the first TLC block.

20 Claims, 7 Drawing Sheets

(51) Int. Cl.
    *G11C 16/34*           (2006.01)
    *G11C 16/22*           (2006.01)

(56) References Cited

U.S. PATENT DOCUMENTS

| | | |
|---|---|---|
| 2014/0281151 A1 | 9/2014 | Yu et al. |
| 2015/0106557 A1 | 4/2015 | Yu et al. |
| 2015/0109859 A1 | 4/2015 | Hsu et al. |
| 2016/0054942 A1 | 2/2016 | Yu et al. |
| 2016/0070474 A1 | 3/2016 | Yu et al. |
| 2017/0177235 A1* | 6/2017 | Nishikubo ............ G06F 3/0605 |

* cited by examiner

DATA STORAGE DEVICE AND DATA WRITING METHOD THEREOF

CROSS REFERENCE TO RELATED APPLICATIONS

This Application claims priority to Taiwan Patent Application No. 105134401, filed on Oct. 25, 2016, the entirety of which is incorporated by reference herein.

BACKGROUND OF THE INVENTION

Field of the Invention

The present invention is related to a data writing method for a data storage device, and in particular to a data writing method with a Triple-Level Cell.

Description of the Related Art

Flash memory is considered a non-volatile data-storage device, using electrical methods to erase and program itself. NAND Flash, for example, is often used in memory cards, USB flash devices, solid state devices, eMMCs, and other memory devices.

Flash memory such as NAND Flash uses a multiple-block structure to store data, wherein flash memory uses floating gate transistors. The floating gates of a floating gate transistor may catch electronic charges for storing data. However, the electronics might undergo losses from the floating gate due to the operation of the flash memory or various environmental parameters, which can affect data retention. The Triple-Level Cell (TLC) of the flash memory is much more easily affected by the environment than a Single-Level Cell (SLC) or a Multi-Level Cell (MLC), especially during unexpected power-off events.

BRIEF SUMMARY OF THE INVENTION

A detailed description is given in the following embodiments with reference to the accompanying drawings.

An exemplary embodiment provides a data storage device including a flash memory and a controller. The flash memory has a plurality of TLC blocks, wherein each of the TLC blocks has a plurality of pages numbered in sequence starting from X. The controller checks whether a first number of a first page is greater than a predetermined threshold when the data storage device resumes operation after a power-off event, and stops writing data into a first TLC block when the first number of the first page is greater than the predetermined threshold, wherein the first TLC block was undergoing a first write operation which was unfinished when the power-off event occurred, and the first page was the last one being written in the first TLC block.

Another exemplary embodiment provides a data writing method applied to a data storage device, wherein the data storage device includes a flash memory having a plurality of TLC blocks, and each of the TLC blocks has a plurality of pages numbered in sequence starting from X. The data writing method includes: checking whether any of the TLC blocks was undergoing a write operation which was unfinished at the time that the power-off event occurred when the data storage device resumes operation after a power-off event; checking whether a first number of a first page is greater than a predetermined threshold when a first TLC block was undergoing a first write operation which was unfinished at the time that the power-off event occurred; and when the first number of the first page is greater than the predetermined threshold, stopping the writing of data into a first TLC block when the first number of the first page is greater than the predetermined threshold, wherein the first TLC block was undergoing the first write operation, which was unfinished at the time that the power-off event occurred, and the first page was the last one being written in the first TLC block.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
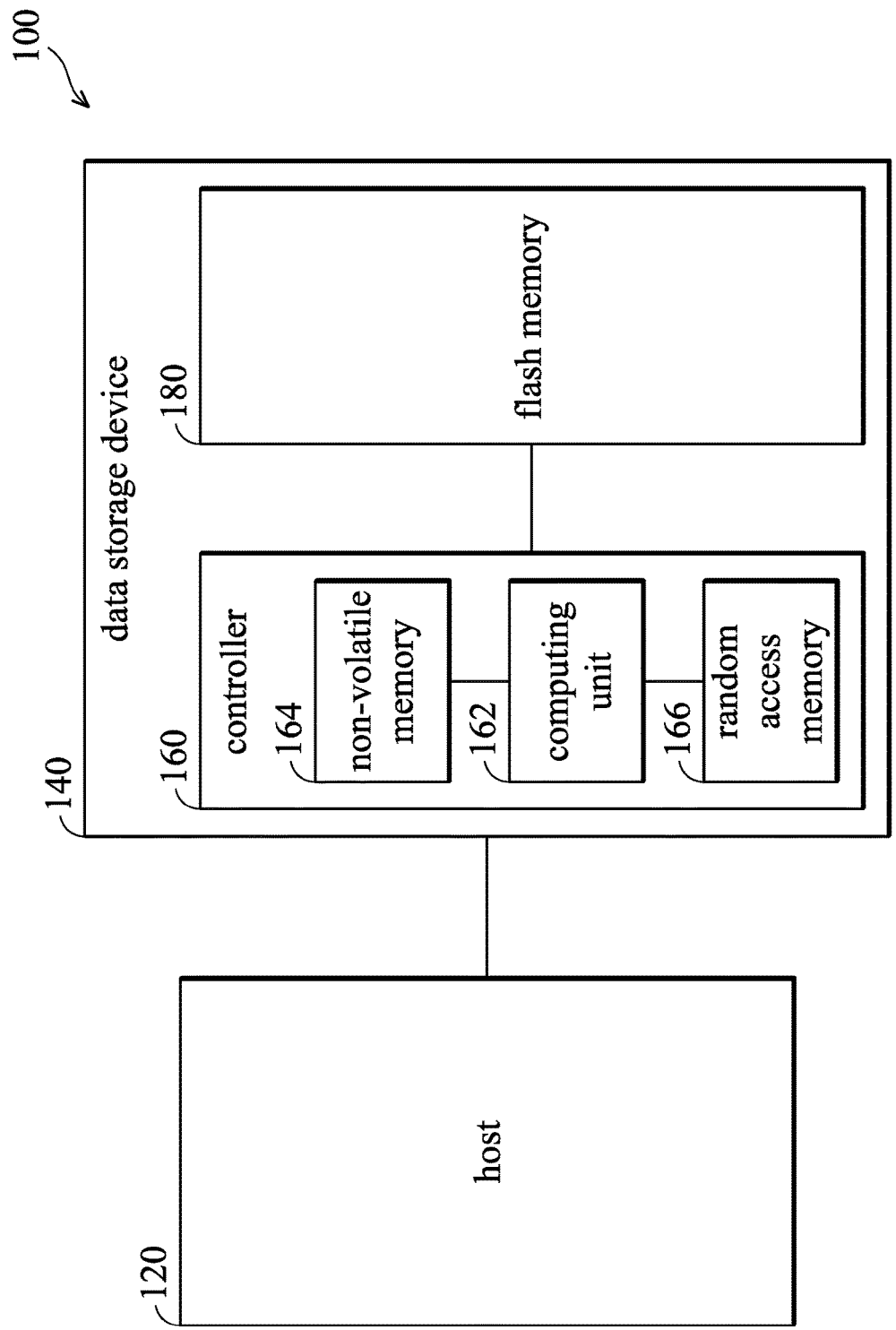
FIG. 1 is a schematic diagram illustrating an electronic system in accordance with an embodiment.

FIG. 1 is a schematic diagram illustrating an electronic system in accordance with an embodiment. The electronic system 100 includes a host 120 and a data storage device 140. The data storage device 140 includes a flash memory 180 and a controller 160, and operates in response to the commands of the host 120. The controller 160 includes a computing unit 162, a non-volatile memory 164 (ROM) and a random access memory 166 (RAM). The non-volatile memory 164, the program code stored in the non-volatile memory 164 and data stored in the non-volatile memory 164 constitute firmware executed by the processing unit 162, and the controller 160 is configured to control the flash memory 180 based on the firmware. The random access memory 166 is arranged to load the program codes and parameters for the controller 160. The flash memory 180 includes a plurality of blocks, and each of the blocks has a plurality of pages, wherein the minimum write unit of the flash memory 180 is a page, and the minimum erase unit of the flash memory 180 is a block. In some of embodiments, the controller 160 may include an error correction engine arranged to perform Error Correction on the read data and encode the write data to obtain the parity codes, wherein the error correction engine may obtain the error bits of data stored in the page by reading the page.

Figure 2:
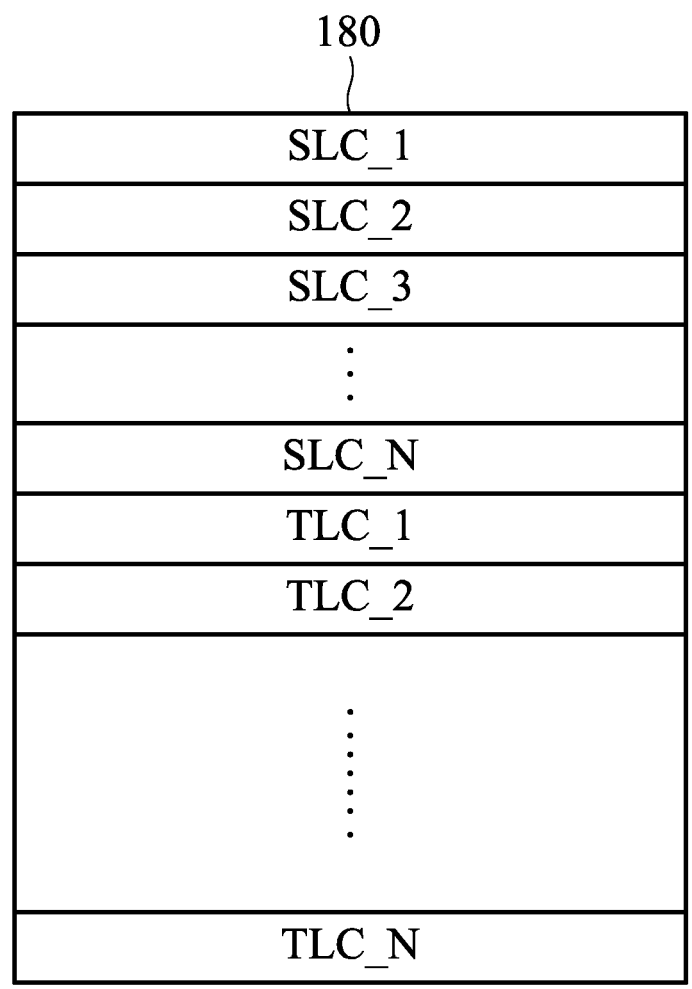
FIG. 2 is a schematic diagram illustrating a flash memory in accordance with an embodiment.

In one of the embodiments, the blocks of the flash memory 180 may include a plurality of SLC blocks SLC_1~SLC_N and a plurality of TLC blocks TLC_1~TLC_N (as shown in FIG. 2), wherein each of the SLC blocks SLC_1~SLC_N has a plurality of pages, and each of the TLC blocks TLC_1~TLC_N also has a plurality of pages which are numbered in sequence starting from X, wherein X can be 0 or 1, but it is not limited thereto. It should be noted that each of the TLC blocks TLC_1~TLC_N and SLC blocks SLC_1~SLC_N has a plurality of word lines, each of the TLC blocks TLC_1~TLC_N and SLC blocks SLC_1~SLC_N has a corresponding word line, wherein the word lines are also numbered in sequence. The word line is arranged to select the target page which is going to be accessed. Therefore, each of the word lines controls a specific page of a block, but it is not limited thereto. In other embodiments, each of the word lines can control two or three pages in a block. Moreover, the word lines can be used to identify the numbers of pages (the page numbers).

The SLC blocks SLC_1~SLC_N are arranged to be written with data by a Single-Level Cell mode (SLC mode), and the TLC blocks are arranged to be written with data by a Triple-Level Cell mode (TLC mode). Moreover, the memory space of each of the TLC blocks TLC_1~TLC_N is three times larger than the memory space of each of the SLC blocks SLC_1~SLC_N. More specifically, all of the pages of the TLC blocks and the SLC blocks have the same physical construction. However, the page of the TLC block has to be programmed by a specific voltage more than one time to be written with data, and the page of the SLC block only has to be programmed by a specific voltage one time to be written with data. In one embodiment, the page of the TLC block has to be programmed by a specific voltage three times to be written with data. Namely, the valid data of three SLC blocks can be written into one TLC block, but it is not limited thereto.

It should be noted that the flash memory 180 of the present invention is operated as Triple-Level Cell (TLC), and the flash memory 180 also includes some blocks arranged to be operated as Single-Level Cell (SLC). Before the data is stored into the TLC blocks TLC_1~TLC_N, the data has to be stored in the SLC blocks SLC_1~SLC_N first. During the period of storing data, the controller 160 is configured to read a predetermined number of SLC blocks a predetermined number of times to program the data of the read SLC blocks into a TLC block. More specifically, when the controller 160 needs to write data into a specific TLC block of the flash memory 180, the controller 160 will write the data into a predetermined number of specific SLC blocks first. Next, the controller 160 performs read operations on the specific SLC blocks a predetermined number of times to program the read data into the specific TLC block. Namely, the write operation of the TLC blocks is arranged to program the data stored in the predetermined number of SLC blocks into the TLC block.

Figure 3:
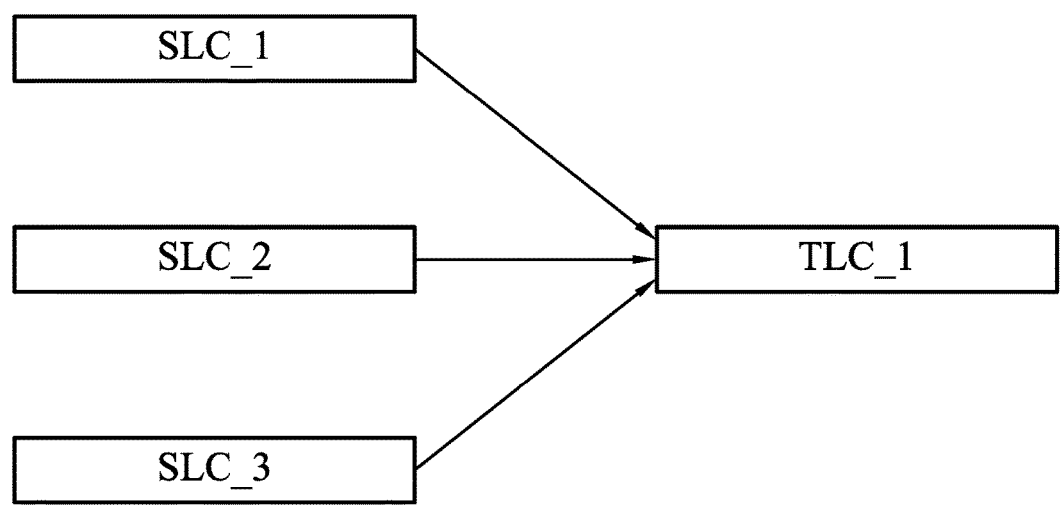
FIG. 3 is a schematic diagram illustrating relationships of SLC and TLC blocks in accordance with an embodiment.

In one embodiment, the first predetermined number is three, but it is not limited thereto. In other embodiments, the first predetermined number can also be 4, 5, 6, 7, 8 or another positive integer. For example, the controller 160 is required to write data into a specific TLC block TLC_1 of the flash memory 180, as shown in FIG. 3. Firstly, the controller 160 writes the data into three of the specific SLC blocks SLC_1~SLC_3. Next, the controller 160 performs a first read operation on the first page of each of the specific SLC blocks SLC_1~SLC_3 to program the first page of the specific TLC block TLC_1 according to the data read from the first pages of the specific SLC blocks SLC_1~SLC_3 for the first time. Next, the controller 160 performs a second read operation on the same first page of each of the specific SLC blocks SLC_1~SLC_3 to program the same first page of the specific TLC block TLC_1 according to the data read from the first pages of the specific SLC blocks SLC_1~SLC_3 for the second time. Lastly, the controller 160 performs a third read operation on the same first page of each of the specific SLC blocks SLC_1~SLC_3 to program the same first page of the specific TLC block TLC_1 according to the data read from the first pages of the specific SLC blocks SLC_1~SLC_3 for the third time. From the programming three times described above, the data stored in the first page of each of the SLC blocks SLC_1~SLC_3 has been written into the first page of the specific TLC block TLC_1. Similarly, the controller 160 continues to repeat the above steps until the data of all the pages of the specific SLC blocks SLC_1~SLC_3 has been written into the specific TLC block TLC_1.

As described above, writing the TLC blocks TLC_1~TLC_N takes more time than writing the SLC blocks. Therefore, power-off events have more opportunities to occur during the write operations of TLC blocks TLC_1~TLC_N. In one embodiment, when a power-off event has occurred during a write operation of a TLC block, controller 160 selects a new TLC block and writes the data of the SLC blocks, which was arranged to be written into the original TLC block, into the new TLC block. It should be noted that the controller 160 may determine whether a power-off event occurred during a write operation of a TLC block according to the tables stored in the flash memory 180 (or other memory) when the data storage device 140 resumes operation after the power-off event. For example, the flash memory 180 may have a table arranged to record a write operation of the page or block that was started and another table arranged to record whether the write operation was finished. In this embodiment, the controller 160 may determine whether the write operation was interrupted according to the above two tables of the flash memory 180, but it is not limited thereto. In other embodiments, the data storage device 140 can also record the status of writing data according to at least one table or flag. Moreover, if any of the pages of the TLC block has not been written, the write operation of the TLC block is unfinished.

In some conditions, such as the manufacturing process or a testing process of the data storage device 140, it is more likely that the data storage device 140 will suffer from power failures. Therefore, the above method of writing data into another new TLC block will cause the controller 160 to continuously select a new block and fail to finish the current write operation, wasting the resources of the TLC block and the controller 160.

In view of this, in one of the embodiments of the present invention, when the data storage device resumes operation after a power-off event, the controller 160 checks whether any of the TLC blocks was undergoing a write operation which was unfinished at the time that a power-off event occurred. When a first TLC block was undergoing a write operation which was unfinished at the time that the power-off event occurred, the controller 160 further checks whether data stored in a page which was the last one written in the first TLC block can be successfully read. It should be noted that, in this invention, when the data cannot be successfully read it means that the controller 160 cannot correct all the error bits in the data read from the page by error correction or other methods. Conversely, when the data can be successfully read it means that the controller 160 has corrected all the error bits in the data read from the page using error correction or another method. Moreover, in this invention, "the write operation that has not finished" indicates a write operation that was started but not finished. It should be noted that, in one embodiment, the step of checking whether the data of the first page can be successfully read can be bypassed. When the data of the page cannot be successfully read, the controller 160 selects a new TLC block from the TLC blocks, and writes the data of the write operation which was arranged to be written into the first TLC block into the new TLC block. Namely, the controller 160 writes the data in the SLC blocks, which was arranged to be written into the first TLC block, into the new TLC block. It should be noted that the controller 160 selects the TLC block which is not the first TLC block and does not have valid data to serve as the new TLC block, but it is not limited thereto. In other embodiments, the controller 160 can also select a new TLC block according to the erase count, write count and/or other parameters. When the data of the page can be successfully read, the controller 160 checks whether a first number of a first page is greater than a predetermined threshold, wherein the first page was the last one being written in the first TLC block. In one embodiment, the controller 160 further checks whether the number of the first word line corresponding to the first page is higher than a threshold to determine whether the first number of the first page is greater than the predetermined threshold.

When the first number of the first page is lower than the predetermined threshold, the controller 160 selects a new TLC block from the TLC blocks TLC_1~TLC_N to write the data which was arranged to be written into the first TLC block into the new TLC block. Namely, the controller 160 writes the data, which is temporally stored in the SLC blocks and arranged to be programmed into the first TLC block, into the new TLC block. It should be noted that the controller 160 is arranged to select the TLC block that is not the first TLC block and does not have valid data to serve as the new TLC block, but it is not limited thereto. In other embodiments, the controller 160 can also select the new TLC block according to the erase count, write count and/or other parameters.

When the first number of the first page is greater than the predetermined threshold, the controller 160 stops writing the data into the first TLC block to close the first TLC block. In one embodiment, the controller 160 is configured to write dummy data into the pages of the first TLC block except for at least one specific page of the first TLC block to close the first TLC block. More specifically, the numbers of specific pages are X~Y, and Y is equal to the first number of the first page minus a first predetermined value. Moreover, the valid data of the pages of the first block except for the pages with numbers X~Y will be written into another TLC block in the next write operation. In one embodiment, the first predetermined value is 4, but it is not limited thereto. The circuit designer can determine the first predetermined value according to the characteristics of the TLC block of the flash memory produced by different manufactures. Next, in one embodiment, the controller 160 further checks whether the number of error-bits in any of the pages with valid data in the first TLC block is greater than a second predetermined value after the first TLC block is closed. When any of the pages in the first TLC block has more error-bits than the second predetermined value, the controller 160 selects a new TLC block from the TLC blocks TLC_1~TLC_N to write the data which was arranged to be written into the first TLC block into the new TLC block. It should be noted that the second predetermined value can be determined by the circuit designer according to the capability of error correction or can be formulated by the specification. For example, the maximum number of error bits that can be corrected is 50, so the circuit designer can set the first predetermined number to 45~50, but it is not limited thereto. Namely, the first predetermined number is arranged to determine whether the data can be successfully corrected now or in the future.

Moreover, when no power-off event has occurred during the write program performed on any TLC block, the controller 160 continues to perform other tasks and bypasses the step of checking the number of error bits in the pages in the TLC block after the write operation of the TLC block is done. Namely, when no power-off event has occurred since the write operation of the first TLC block started until the write operation is finished, the controller 160 will not check whether the number of error bits of any page of the first TLC block is higher than a second predetermined value.

Is should be noted that, when the number of empty TLC blocks is not enough, the controller 160 will perform a garbage collection process to move the data for releasing the blocks which were occupied by invalid data. The less the value of the predetermined threshold is, the more the invalid data in the TLC blocks are. Namely, the more the predetermined threshold is, the less the invalid data in the TLC blocks. The TLC blocks which have more invalid data will be chosen to be processed by garbage collection. Therefore, the value of the predetermined threshold will cause the data of the TLC blocks to be moved, and excessive movement will damage the TLC blocks. Therefore, if the value of the predetermined threshold is designed too big, the undamaged TLC blocks will not be able to be kept after the power-off event which leads to a waste of blocks. Therefore, in one embodiment, when each of the TLC blocks TLC_1~TLC_N has a second predetermined number of pages, the predetermined threshold is between one-half and one-third of the second predetermined number. For example, when each of the TLC blocks TLC_1~TLC_N has 258 pages (the second predetermined number is 258), the predetermined threshold can be any value between 86~129, such as 86, 87, 91 or 93. In another embodiment, the predetermined threshold can be one-third of the second predetermined number.

Figure 4:
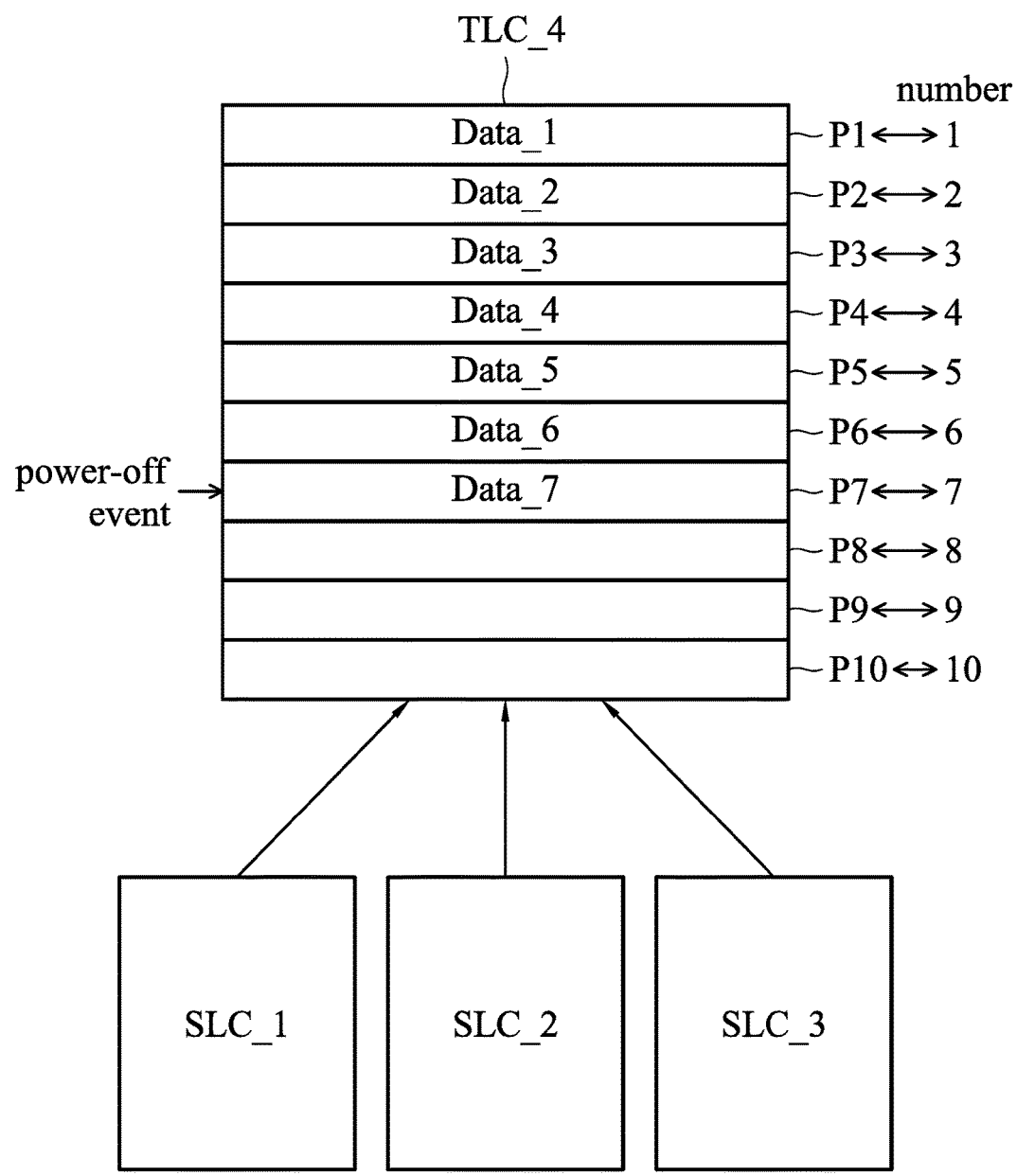
FIG. 4 is a schematic diagram illustrating write operation of SLC and TLC blocks in accordance with an embodiment.

For example, as shown in FIG. 4, the controller 160 is going to program/write the data stored in the SLC blocks SLC_1~SLC_3 into the TLC block TLC_4. In this embodiment, the TLC block TLC_4 has ten pages numbered in sequence starting from "1". If the data sectors Data_1~Data_7 are respectively written into the pages P1~P7, and a power-off event occurs at the time that the controller 160 is writing the data sector Data_7 into the page P7 of the TLC block TLC_4, then when the data storage device 140 resumes operation after the power-off event, the controller 160 checks whether the power-off event occurred during the write operation of the TLC block TLC_4. Namely, the controller 160 determines whether any of the TLC blocks was undergoing a write operation which was unfinished at the time that the power-off event occurred. Next, the controller 160 checks whether the data of the page P7 which was the last one being written in the TLC block TLC_4 can be successfully read.

When the data of the page P7 cannot be successfully read, the controller 160 select an empty TLC block from the TLC blocks TLC_1~TLC_3 and TLC_5~TLC_N to write the data sectors which were arranged to be written into the TLC block TLC_4 into the new selected TLC block. When the data of the page P7 can be successfully read, the controller 160 checks whether the number of the page P7 is greater than a predetermined threshold. In this embodiment, the number of the page P7 is 7, and the predetermined threshold is 4. In this embodiment, the number of the page P7 is greater than the predetermined threshold. Therefore, the controller 160 stops writing data into the TLC block TLC_4 and closes the TLC block TLC_4. In one embodiment, the controller 160 writes dummy data into the pages of the TLC block TLC_4 other than at least one specific page to close the TLC block TLC_4, wherein the dummy data can be predetermined as meaningless data or random data. More specifically, the numbers of specific pages are X~Y. In this embodiment, "Y" is equal to the number of the page P7 "7" minus a first predetermined value "3". Therefore, the specific pages are pages P1~P4, and the controller 160 writes the dummy data into pages P5~P10 of the TLC block TLC_4 to close the TLC block. After the TLC block TLC_4 is closed, the controller 160 is arranged to check whether the number of error-bits in any of the pages P1~P4 which have valid data in the TLC block TLC_4 is greater than a second predetermined value. When any of the pages P1~P4 of the TLC block TLC_4 has more error bits than the second predetermined value, the controller 160 selects a new TLC block from the TLC blocks TLC_1~TLC_N to write the data which was arranged to be written into the TLC block TLC_4 into the new TLC block. It should be noted that, in this embodiment, the data sectors Data_5~Data_7 will be written into the new TLC block in the next write operation after the TLC block TLC_4 is closed.

In another embodiment, the predetermined threshold is 8, and the number "7" of the page P7 is lower than the predetermined threshold "8". The controller 160 selects a new empty TLC block from the TLC blocks TLC_1~TLC_N, such as the TLC block TL_5), to write the data which was arranged to be written in the TLC block TLC_4 into the TLC block TLC_5. Namely, the controller 160 rewrites the data stored in the SLC blocks SLC_1~SLC3 into the TLC block TLC_5.

Figure 5:
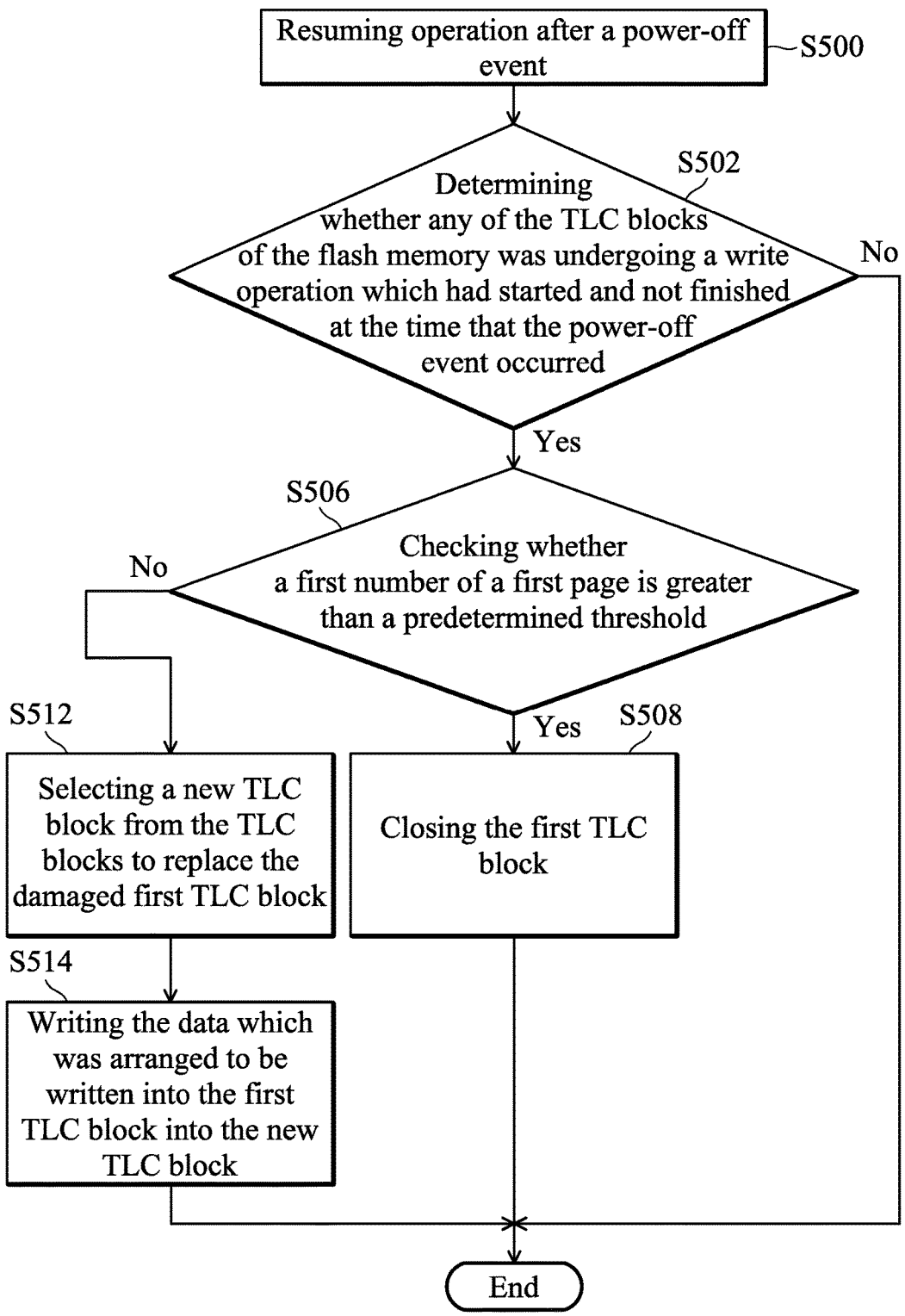
FIG. 5 is a flowchart of a data writing method in accordance with an embodiment.

FIG. 5 is a flowchart of a data writing method in accordance with an embodiment. The data writing method is applied to the data storage device 140 of FIG. 1. The process starts at step S500.

In step S500, the data storage device 140 resumes operation after a power-off event. It should be noted that the power-off event of the present invention may include events in which power to the data storage device 140 was expectedly or unexpectedly cut off, but it is not limited thereto. In other embodiments, the power-off event may only include events in which power to the data storage device 140 was cut off unexpectedly.

In step S502, the controller 160 determines whether any of the TLC blocks of the flash memory 180 was undergoing a write operation which had started and not finished at the time that the power-off event occurred. When the controller 160 determines that a first TLC block was undergoing a write operation which had started and not finished at the time that the power-off event occurred, the process goes to step S506. When the controller 160 determines that no TLC block was undergoing a write operation at the time that the power-off event occurred, the process ends at step S502.

In step S506, the controller 160 checks whether a first number of a first page is greater than a predetermined threshold, wherein the first page was the last one being written in the first TLC block. In one embodiment, when each of the TLC blocks TLC_1~TLC_N has a second predetermined number of pages, and the predetermined threshold is between one-half and one-third of the second predetermined number. For example, when each of the TLC blocks TLC_1~TLC_N has 258 pages (the second predetermined number is 258), the predetermined threshold can be any value between 86~129, such as 86, 87, 91 or 93. In another embodiment, the predetermined threshold can be one-third of the second predetermined number. When the first number of the first page is greater than the predetermined threshold, the process goes to step S508. When the first number of the first page is lower than a predetermined threshold, the process goes to step S512.

In step S508, the controller 160 will not abandon the first TLC block, and closes the first TLC block. Namely, the controller 160 keeps the first TLC block and stops writing valid data into the first TLC block. In one embodiment, the controller 160 is configured to write dummy data into the pages of the first TLC block except for at least one specific page of the first TLC block to close the first TLC block. More specifically, the numbers of specific pages are X~Y, and Y is equal to the first number of the first page minus a first predetermined value. Moreover, the valid data of the pages of the first block except for the pages with numbers X~Y will be written into another TLC block in the next write operation. The process ends at step S508.

In step S512, the controller 160 selects a new TLC block from the TLC blocks TLC_1~TLC_N to replace the damaged first TLC block. It should be noted that the controller 160 is arranged to select the TLC block that is not the first TLC block and does not have valid data to serve as the new TLC block, but it is not limited thereto. In other embodiments, the controller 160 can also select the new TLC block according to the erase count, write count and/or other parameters.

Next, in step S514, the controller 160 writes the data which was arranged to be written into the first TLC block into the new TLC block. Namely, the controller 160 writes the data in the SLC blocks, which was arranged to be written into the first TLC block, into the new TLC block. The process ends at step S514.

Figure 6A:
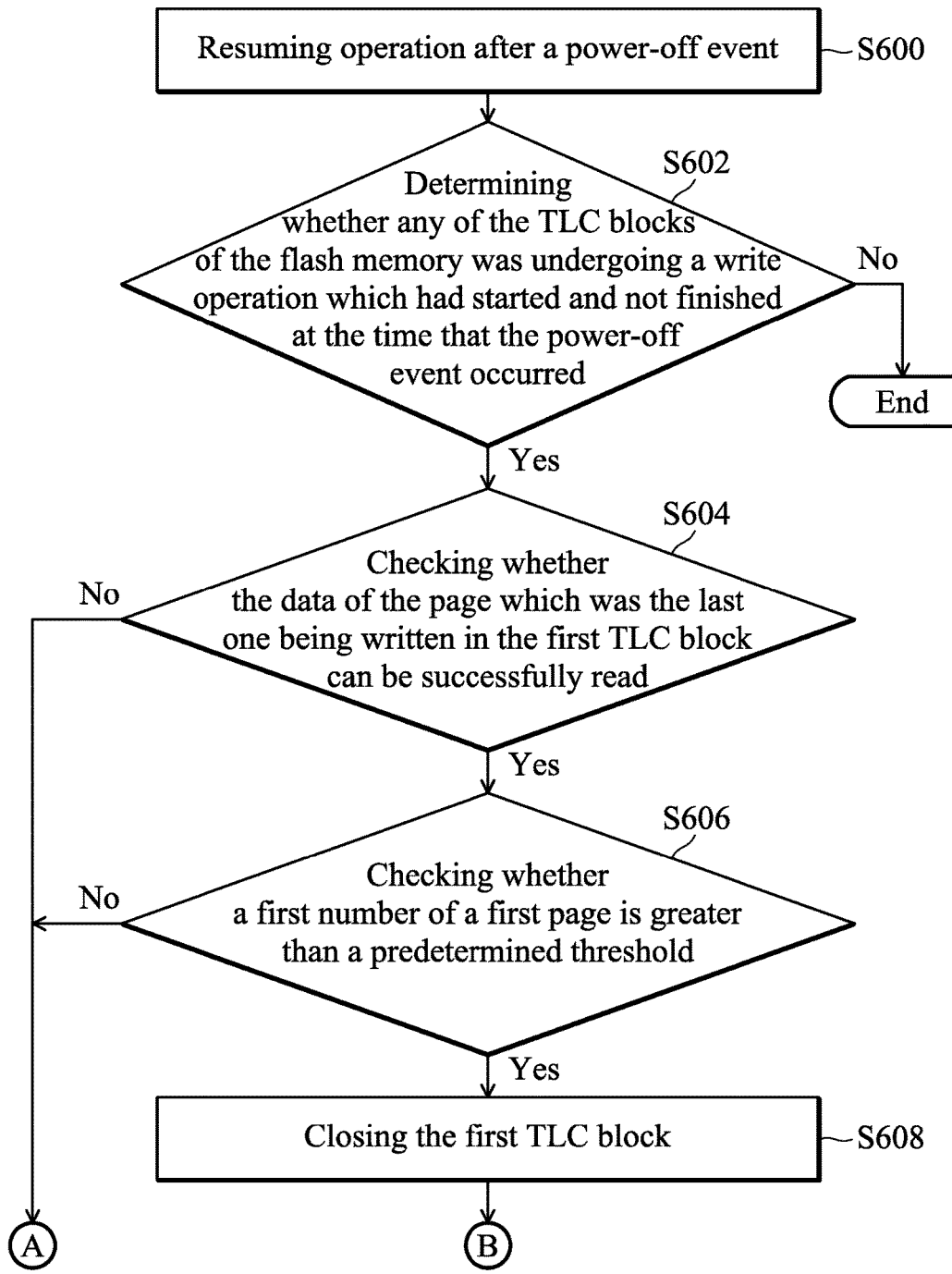
FIGS. 6A-6B are a flowchart of a data writing method in accordance with another embodiment.
Figure 6B:
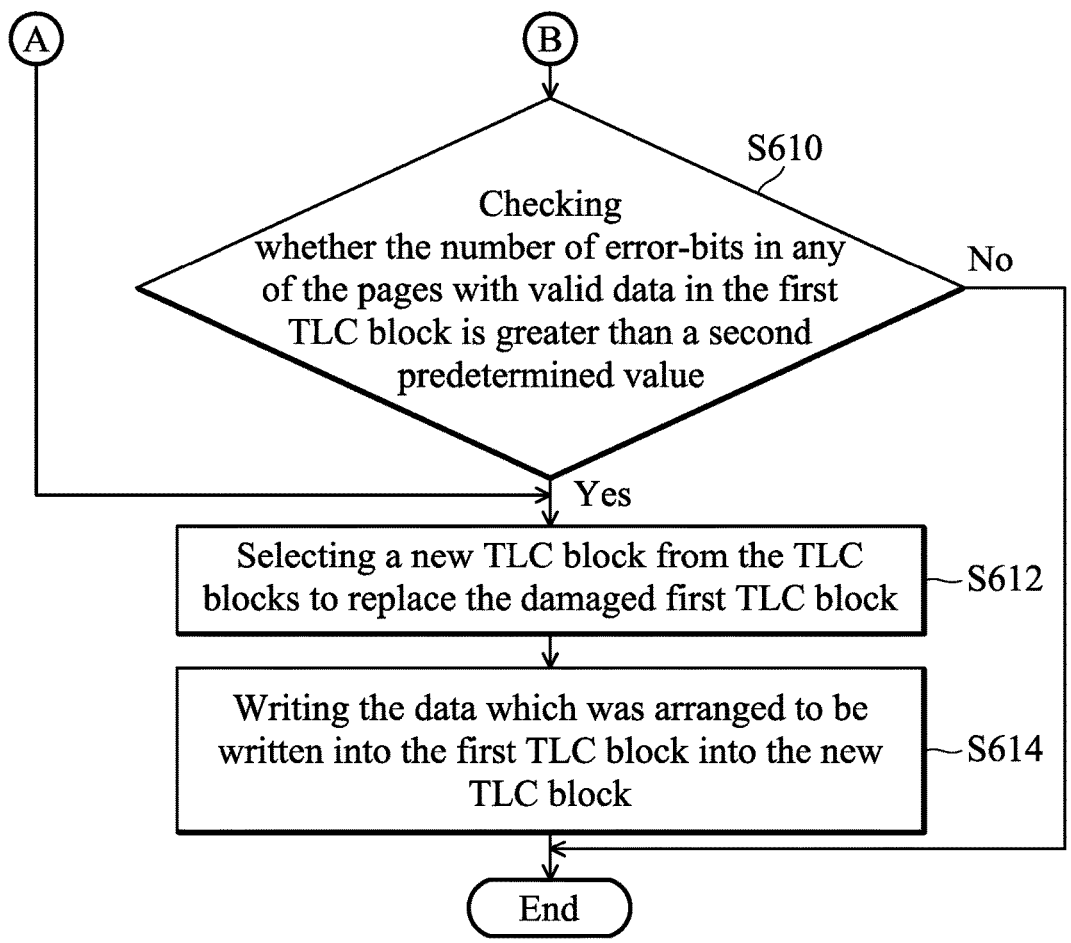

FIGS. 6A-6B are a flowchart of a data writing method in accordance with another embodiment. The data writing method is applied to the data storage device 140 of FIG. 1. The process starts at step S600, wherein steps S600, S602, S606, S608, S612 and S614 are respectively similar to steps S500, S502, S506, S508, S512 and S514 of FIG. 5. FIG. 5 can be referred to for details of steps S600, S602, S606, S608, S612 and S614.

In step S604, the controller 160 checks whether the data of the page which was the last one being written in the first TLC block can be successfully read. When the page which was the last one being written in the first TLC block can be successfully read, the process goes to step S606. When the page which was the last one being written in the first TLC block cannot be successfully read, the process goes to step S612. It should be noted that, in this invention, when the data cannot be successfully read it means that the controller 160 cannot correct all the error bits in the data read from the page using error correction or another method. Conversely, when the data can be successfully read it means that the controller 160 has corrected all the error bits in the data read from the page using error correction or another method In step S610, the controller 160 checks whether the number of error-bits in any of the pages with valid data in the first TLC block is greater than a second predetermined value. When the number of error-bits in a page with valid data in the first TLC block is greater than the second predetermined value, the process goes to step S616, otherwise, the process ends at step S614.

As described above, the data storage device 140 and the data writing method of the present invention can continue to use the TLC block affected by the power-off event to avoid wasting TLC blocks and reduce the erase count of TLC blocks. Moreover, the data storage device 140 and the data writing method can continue to use the TLC block which was undergoing a write operation during the power-off event to avoid wasting the TLC block and to reduce the erase count of the TLC blocks. Moreover, the data storage device 140 and the data writing method can also bypass the checking of the TLC blocks which were not undergoing a write operation at the time of the power-off event, thereby increasing the efficiency of the data storage device 140.

Data transmission methods, or certain aspects or portions thereof, may take the form of program code (i.e., executable instructions) embodied in tangible media, such as floppy diskettes, CD-ROMS, hard drives, or any other machine-readable storage medium, wherein, when the program code is loaded into and executed by a machine such as a computer, the machine thereby becomes an apparatus for practicing the methods. The methods may also be embodied in the form of program code transmitted over some transmission medium, such as electrical wiring or cabling, through fiber optics, or via any other form of transmission, wherein, when the program code is received and loaded into and executed by a machine such as a computer, the machine becomes an apparatus for practicing the disclosed methods. When implemented on a general-purpose processor, the program code combines with the processor to provide a unique apparatus that operates analogously to application-specific logic circuits.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A data storage device, comprising:
   a flash memory, having a plurality of TLC blocks, wherein each of the TLC blocks has a plurality of pages numbered in sequence starting from X; and
   a controller, checking whether a first number of a first page is greater than a predetermined threshold when the data storage device resumes operation after a power-off event, and stopping the writing of data into a first TLC block when the first number of the first page is greater than the predetermined threshold, wherein the first TLC block was undergoing a first write operation which was unfinished when the power-off event occurred, and the first page was the last one being written in the first TLC block.

2. The data storage device as claimed in claim 1, wherein the flash memory has a plurality of SLC blocks, and each of the SLC blocks has a plurality of pages, wherein the first write operation of the first TLC block is arranged to program the data stored in a first predetermined number of SLC blocks into one of the TLC blocks.

3. The data storage device as claimed in claim 1, wherein each of the TLC blocks has a second predetermined number of pages, and the predetermined threshold is between one-half and one-third of the second predetermined number.

4. The data storage device as claimed in claim 1, wherein the controller further writes dummy data into the pages of the first TLC block other than at least one specific page to close the first TLC block.

5. The data storage device as claimed in claim 1, wherein the numbers of the specific pages are X~Y, and Y is equal to the first number of the first page minus a first predetermined value.

6. The data storage device as claimed in claim 4, wherein after the first TLC block is closed, the controller checks whether number of error-bits in each of the pages in the first TLC block is higher than a second predetermined value.

7. The data storage device as claimed in claim 6, wherein when the number of error-bits in any of the pages of the first TLC block is higher than the second predetermined value, the controller selects a second TLC block from the TLC blocks and performs a second write operation to write the data of the first TLC block into the second TLC block.

8. The data storage device as claimed in claim 6, wherein when no power-off event has occurred during the second write operation of the second TLC block, the controller continues to execute other tasks and bypasses the step of checking whether the number of error-bits of the second TLC block is higher than the second predetermined value after the second write operation of the second TLC block.

9. The data storage device as claimed in claim 1, wherein when the first number of the first page is lower than the predetermined threshold, the controller selects a second TLC block from the TLC blocks and writes the data which was arranged to be written into the first TLC block into the second TLC block.

10. The data storage device as claimed in claim 1, wherein before checking whether the first number of the first page is higher than the predetermined threshold, the controller further checks whether the first page can be successfully read, and performs the step of checking whether the first number of the first page is higher than the predetermined threshold when the first page can be successfully read.

11. A data writing method, applied to a data storage device, wherein the data storage device comprises a flash memory having a plurality of TLC blocks, each of the TLC blocks has a plurality of pages numbered in sequence starting from X, and the data writing method further comprises:
    when the data storage device resumes operation after a power-off event, checking whether any of the TLC blocks was undergoing a write operation which was unfinished at the time that the power-off event occurred;
    when a first TLC block was undergoing a first write operation which was unfinished at the time that the power-off event occurred, checking whether a first number of a first page is greater than a predetermined threshold; and
    when the first number of the first page is greater than the predetermined threshold, stopping the writing of data into a first TLC block when the first number of the first page is greater than the predetermined threshold, wherein the first TLC block was undergoing the first write operation which was unfinished at the time that the power-off event occurred, and the first page was the last one being written in the first TLC block.

12. The data writing method as claimed in claim 11, wherein the flash memory has a plurality of SLC blocks, and the first write operation of the first TLC block is arranged to program the data stored in a first predetermined number of SLC blocks into one of the TLC blocks.

13. The data writing method as claimed in claim 11, wherein each of the TLC blocks has a second predetermined number of pages, and the predetermined threshold is between one-half and one-third of the second predetermined number.

14. The data writing method as claimed in claim 11, further comprising when the first number of the first page is greater than the predetermined threshold, writing dummy data into the pages of the first TLC block other than at least one specific page to close the first TLC block.

15. The data writing method as claimed in claim 11, wherein the numbers of the specific pages are X~Y, and Y is equal to the first number of the first page minus a first predetermined value.

16. The data writing method as claimed in claim 14, further comprising checking whether the number of error-bits in each of the pages in the first TLC block is higher than a second predetermined value after the first TLC block is closed.

17. The data writing method as claimed in claim 16, further comprising:
when the number of error-bits in any of the pages of the first TLC block is higher than the second predetermined value, selecting a second TLC block from the TLC blocks; and
performing a second write operation to write the data of the first TLC block into the second TLC block.

18. The data writing method as claimed in claim 16, further comprising:
when no power-off event has occurred during the second write operation of the second TLC block, continually executing other tasks and bypassing the step of checking whether the numbers of error-bits of the second TLC block are higher than the second predetermined value after the second write operation of the second TLC block is finished.

19. The data writing method as claimed in claim 11, further comprising:
when the first number of the first page is lower than the predetermined threshold, selecting a second TLC block from the TLC blocks and writing the data which was arranged to be written into the first TLC block into the second TLC block.

20. The data writing method as claimed in claim 11, further comprising:
before checking whether the first number of the first page is higher than the predetermined threshold, checking whether the first page can be successfully read; and
when the first page can be successfully read, performing the step of checking whether the first number of the first page is higher than the predetermined threshold.

* * * * *